US012810891B2

(12) United States Patent
Gan et al.

(10) Patent No.: US 12,810,891 B2
(45) Date of Patent: Nov. 24, 2026

(54) MAGNESIUM OXIDE SEED LAYER FOR HIGH MAGNETIC MOMENT MATERIAL WITH AMORPHOUS OR FINE GRAIN STRUCTURE

(71) Applicant: Headway Technologies, Inc., Milpitas, CA (US)

(72) Inventors: Huadong Gan, Union City, CA (US); Shohei Kawasaki, Sunnyvale, CA (US); Kunliang Zhang, Fremont, CA (US); Yewhee Chye, Hayward, CA (US); Soroosh Sharifi-Asl, San Jose, CA (US); Kaiyang Niu, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 19/024,453

(22) Filed: Jan. 16, 2025

(65) Prior Publication Data

US 2026/0204281 A1 Jul. 16, 2026

(51) Int. Cl.

*G11B 5/39* (2006.01)
*H10N 50/01* (2023.01)
*H10N 50/10* (2023.01)
*H10N 50/85* (2023.01)
*G11B 5/48* (2006.01)

(52) U.S. Cl.

CPC .......... *G11B 5/3912* (2013.01); *G11B 5/3909* (2013.01); *H10N 50/01* (2023.02); *H10N 50/10* (2023.02); *H10N 50/85* (2023.02); *G11B 5/4826* (2013.01)

(58) Field of Classification Search

None
See application file for complete search history.

(56) References Cited

U.S. PATENT DOCUMENTS 8,670,218 B1 * 3/2014 Zeltser .................. B82Y 10/00 360/324.2
9,053,720 B1 * 6/2015 Chye .................. G01R 33/098
(Continued)

OTHER PUBLICATIONS

"Rare earth elements: A review of applications, occurrence, exploration, analysis, recycling, and environmental impact," V. Balaram, Geoscience Frontiers, pp. 1285-1303 (2019) (Year: 2019).*

*Primary Examiner* — William J Klimowicz
(74) *Attorney, Agent, or Firm* — DLA Piper LLP (US)

(57) ABSTRACT

The present embodiments relate to a tunneling magnetoresistive (TMR) sensor structure with an oxide seed layer that can generally promote the magnetic moment of an Iron-Nickel-Rhenium (FeNiRe) junction shield film, and a magnesium oxide (MgO) seed layer can be magnetic moment at the highest level and provide a low Hc. Particularly, the present embodiments can provide a rare earth doped NiFe or CoFe for a junction shield application, such as a FeNiRe material for a junction shield application. Further, an oxide seed layer of a rare earth doped NiFe or CoFe can be used for junction shield application. In some instances, an oxide seed layer of FeNiRe film can be used for junction shield application. Additionally, a MgO seed layer of rare earth doped NiFe or CoFe or a MgO/FeNiRe layer can be used for a junction shield application.

6 Claims, 12 Drawing Sheets

(56) References Cited

U.S. PATENT DOCUMENTS

| | | | | |
|---|---|---|---|---|
| 9,466,319 | B1 * | 10/2016 | Tang | G11B 5/3116 |
| 10,354,681 | B1 * | 7/2019 | Chien | G11B 5/3912 |
| 11,302,350 | B1 * | 4/2022 | Zhang | G11B 5/3163 |
| 11,377,749 | B1 * | 7/2022 | Gong | G11B 5/858 |
| 2003/0223157 | A1 * | 12/2003 | Xue | G11B 5/3903 |
| 2004/0051999 | A1 * | 3/2004 | Yazawa | C25D 7/001 360/125.43 |
| 2015/0221325 | A1 * | 8/2015 | Ho | G11B 5/3932 360/99.08 |
| 2019/0112722 | A1 * | 4/2019 | Gong | G11B 5/70615 |
| 2022/0200355 | A1 * | 6/2022 | Bima | H01F 27/2823 |
| 2025/0140285 | A1 * | 5/2025 | Zolla | G11B 5/3912 |
| 2025/0316289 | A1 * | 10/2025 | Asif Bashir | G11B 5/6082 |

* cited by examiner

1100

MAGNESIUM OXIDE SEED LAYER FOR HIGH MAGNETIC MOMENT MATERIAL WITH AMORPHOUS OR FINE GRAIN STRUCTURE

TECHNICAL FIELD

Embodiments of the invention relate to the field of electro-mechanical data storage devices. More particularly, embodiments of the invention relate to a tunneling magneto-resistive (TMR) sensor with an oxide seed layer structure for a high magnetic moment.

BACKGROUND

A magnetic recording medium (e.g., a magnetic disk) can store magnetic bits representing digital data. A magneto-resistive writer can be part of a hard disk drive (HDD) to write digital data to the magnetic recording medium.

As the overall amount of digital data being stored on HDD devices increases, there is an increasing demand for greater data capacity of HDD devices. One technique to increase data capacity for an HDD includes heat-assisted magnetic recording (HAMR) or microwave-assisted magnetic recording (MAMR) technologies. HAMR and MAMR techniques increase the density of HDDs by manipulating a portion of the magnetic recording medium, which can enhance write performance of the write head to the magnetic recording medium.

Further, tunneling magneto-resistive (TMR) sensors with stable shield biasing can be important for various high density magnetic recording applications. The TMR sensor can include any of a free layer, barrier layer, and a pin layer. The magnetization direction of the pin layer can be configured to be fixed and a magnetization direction of the free layer can change due to an external magnetic field direction. Further, electrical resistance of the TMR sensor can decrease when magnetization directions of the pin layer and free layer are in parallel, and the electrical resistance of the TMR sensor can increase when magnetization directions of the pin layer and free layer are anti-parallel.

While developments have been made, further innovation is needed.

SUMMARY

The present embodiments relate to a tunneling magneto-resistive (TMR) sensor structure with an oxide seed layer that can generally promote the magnetic moment of an Iron-Nickel-Rhenium (FeNiRe) junction shield film, and a magnesium oxide (MgO) seed layer that can be magnetic moment at the highest level and provide low coercivity (Hc). Particularly, the present embodiments can provide rare earth doped NiFe or CoFe materials for a junction shield application, such as a FeNiRe material for a junction shield application. Further, an oxide seed layer of rare earth doped NiFe or CoFe can be used for a junction shield application. In some instances, an oxide seed layer of FeNiRe film can be used for a junction shield application. Additionally, a MgO seed layer of rare earth doped NiFe or CoFe or a MgO/FeNiRe layer can be used for a junction shield application.

In a first example embodiment, a tunneling magneto-resistive (TMR) sensor is described. The sensor can include a sensor structure. The sensor can also include a first junction shield (JS) layer disposed adjacent to the sensor structure, wherein the JS layer comprises a Nickel-Iron (NiFe) alloy doped with a rare earth material. The sensor can also include a first insulation layer disposed between the JS layer and the sensor structure at a first side of the sensor structure, the first insulation layer comprising an oxide material.

In some instances, the rare earth material comprises Rhenium (Re).

In some instances, the first JS layer is configured to maintain a low Hc and boost the magnetic moment of the TMR sensor.

In some instances, the sensor can include a seed layer disposed between the first JS layer and the first insulation layer.

In some instances, the first insulation layer comprises Magnesium Oxide (MgO).

In some instances, the first insulation layer comprises a first MgO layer, a second MgO layer, and an Aluminum Oxide (Al2O3) layer disposed between the first MgO layer and the second MgO layer.

In some instances, the sensor can include an Iron-Nickel-Rhenium (NiFeRe) film disposed adjacent to the first insulation layer.

In some instances, the first insulation layer contacts a sidewall of the sensor structure and contacts a top surface of a bottom shield that is not covered by the sensor structure.

In some instances, a second JS layer is disposed at a second side of the sensor structure opposite of the first side, and wherein a second insulation layer is disposed between the second JS layer and the sensor structure at the second side of the sensor structure.

In another example embodiment, a junction shield (JS) structure is provided. The JS structure can include a first junction shield (JS) layer, wherein the JS layer comprises a Nickel-Iron (NiFe) material. The JS structure can also include a first insulation layer comprising an oxide material. The JS structure can also include a seed layer disposed between the first JS layer and the first insulation layer.

In some instances, the JS layer comprises Nickel-Iron (NiFe) doped with a rare earth material.

In some instances, the rare earth material comprises Rhenium (Re).

In some instances, the first insulation layer comprises Magnesium Oxide (MgO).

In some instances, the first insulation layer comprises a first MgO layer, a second MgO layer, and an Aluminum Oxide (Al2O3) layer disposed between the first MgO layer and the second MgO layer.

In some instances, the JS layer comprises an Iron-Nickel-Rhenium (NiFeRe) film disposed adjacent to the first insulation layer.

In some instances, the first insulation layer contacts a sidewall of a sensor structure and contacts a top surface of a bottom shield of a tunneling magneto-resistive (TMR) sensor that is not covered by the sensor structure.

In some instances, the first JS layer is disposed at a first side of the sensor structure and a second JS layer is disposed at a second side of the sensor structure opposite of the first side, and wherein a second insulation layer is disposed between the second JS layer and the sensor structure at the second side of the sensor structure.

In another example embodiment, a method of manufacturing a junction shield (JS) component that is part of a tunneling magneto-resistive (TMR) sensor is provided. The method can include disposing a first junction shield (JS) layer adjacent to the sensor structure, wherein the first JS layer comprises a Nickel-Iron (NiFe) alloy. The method can also include doping the first JS layer with Rhenium (Re) to form a NiFeRe. The method can also include disposing a first insulation layer between the JS layer and the sensor structure at a first side of the sensor structure, the first insulation layer comprising an oxide material.

In some instances, the method can include disposing a seed layer disposed between the first JS layer and the first insulation layer.

In some instances, the method can include disposing a second JS layer at a second side of the sensor structure opposite of the first side and disposing a second insulation layer between the second JS layer and the sensor structure at the second side of the sensor structure.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

A disk drive can include a write head to interact with a magnetic recording medium to read and write digital data to the magnetic recording medium. As the amount of digital data is required to be stored increases and with an increase in data aerial density of hard disk drive (HDD) writing, both the write head and digital data written to the magnetic recording medium can generally be made smaller.

Figure 1:
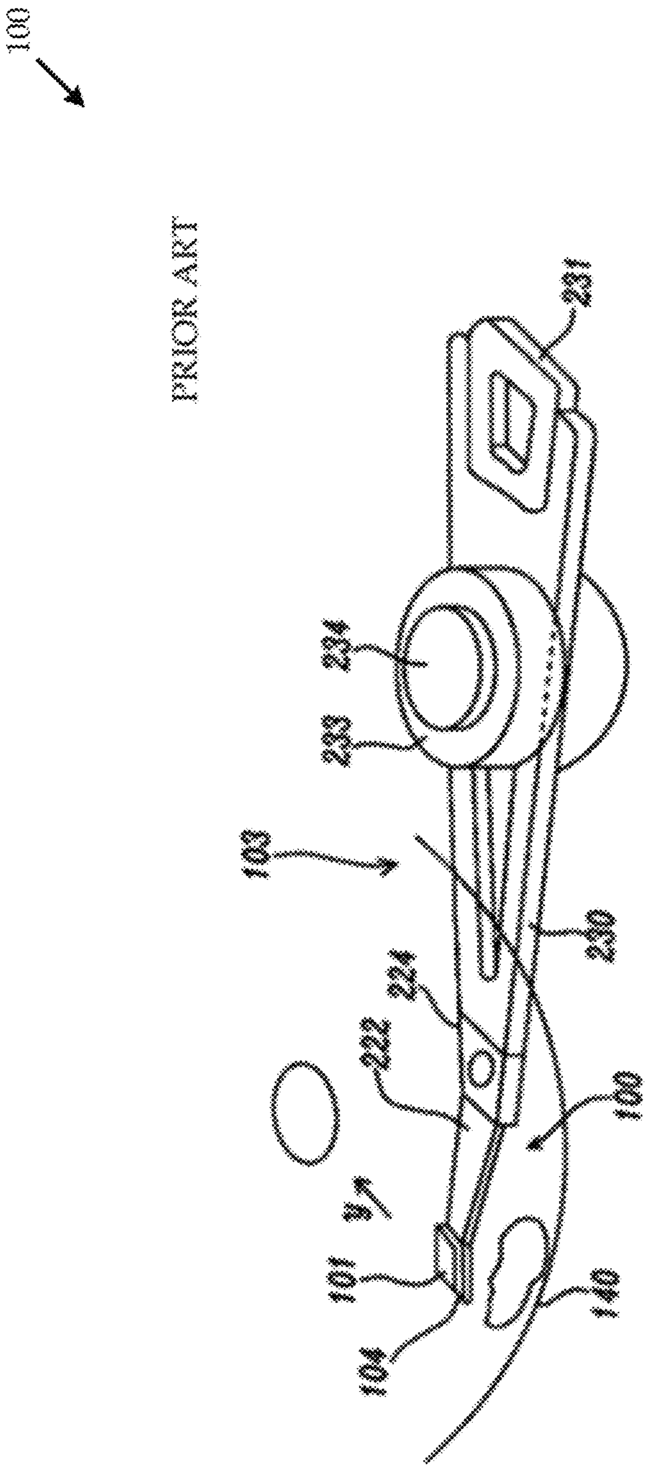
FIG. 1 is a perspective view of a prior art head arm assembly used in a HDD, according to some embodiments.

FIG. 1 is a perspective view of a prior art head arm assembly 100, according to some embodiments of the present disclosure. Referring to FIG. 1, a head arm assembly (or Head Gimbal Assembly (HGA)) 100 includes a magnetic recording head 101 comprised of a slider and a PMR writer structure formed thereon, and a suspension 103 that elastically supports the magnetic recording head. The suspension has a plate spring-like load beam 222 formed with stainless steel, a flexure 104 provided at one end portion of the load beam, and a base plate 224 provided at the other end portion of the load beam. The slider portion of the magnetic recording head is joined to the flexure, which gives an appropriate degree of freedom to the magnetic recording head. A gimbal part (not shown) for maintaining a posture of the magnetic recording head at a steady level is provided in a portion of the flexure to which the slider is mounted.

HGA 100 is mounted on an arm 230 formed in the head arm assembly 103. The arm moves the magnetic recording head 101 in the cross-track direction y of the magnetic recording medium 140. One end of the arm is mounted on base plate 224. A coil 231 that is a portion of a voice coil motor is mounted on the other end of the arm. A bearing part 233 is provided in the intermediate portion of arm 230. The arm is rotatably supported using a shaft 234 mounted to the bearing part 233. The arm 230 and the voice coil motor that drives the arm configure an actuator.

Figure 2:
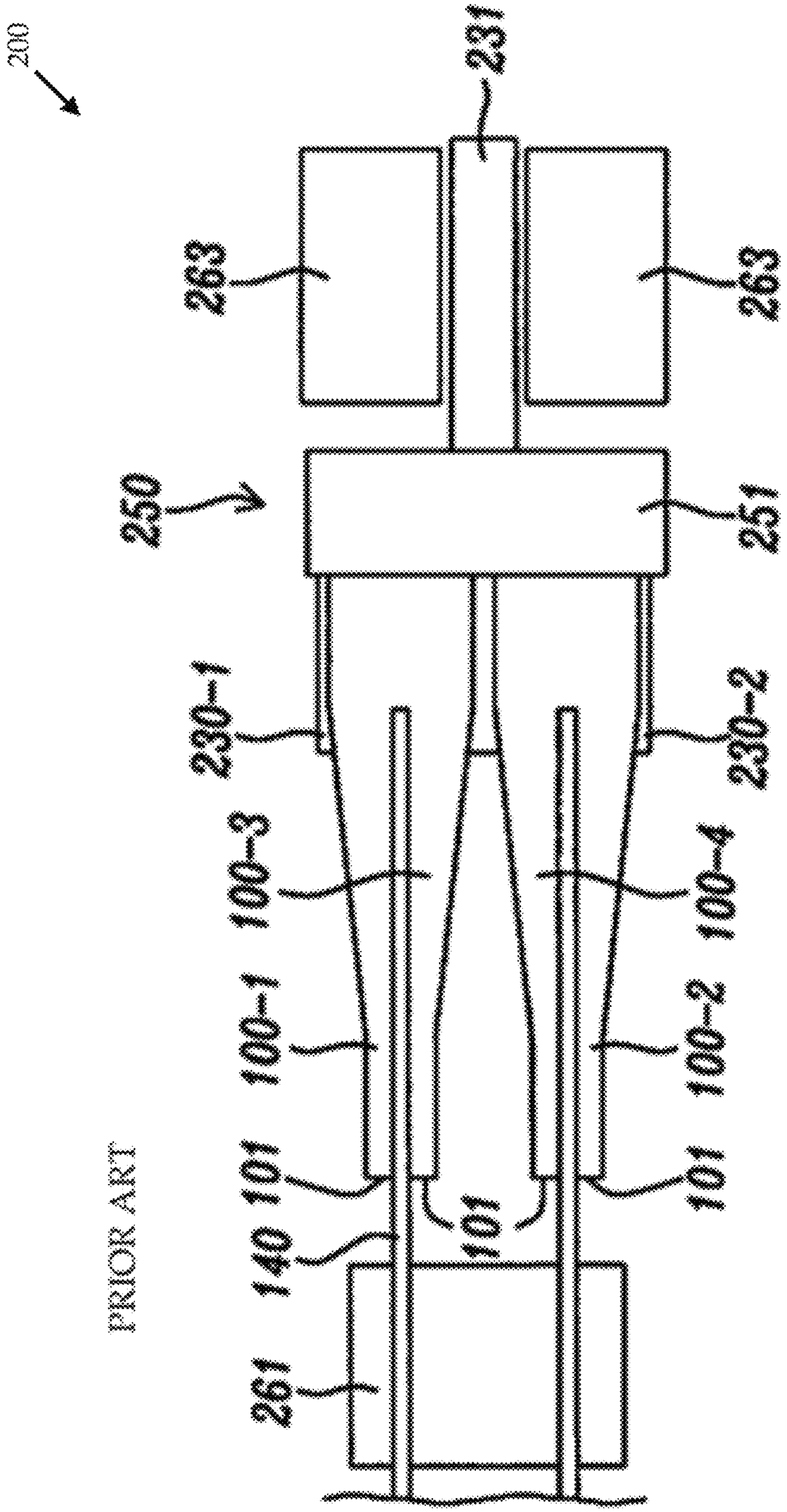
PRIOR ART FIG. 2
FIG. 2 is a side view of a prior art head stack assembly used in a HDD, according to some embodiments.

Next, a side view 200 of a head stack assembly (FIG. 2) and a plan view 300 of a magnetic recording apparatus (FIG. 3) wherein the magnetic recording head 101 is incorporated are depicted. The head stack assembly 250 is a member to which a plurality of HGAs (HGA 100-1 and second HGA 100-2 are at outer positions while HGA 100-3 and HGA 100-4 are at inner positions) is mounted to arms 230-1, 230-2, respectively, on carriage 251. A HGA is mounted on each arm at intervals so as to be aligned in the perpendicular direction (orthogonal to magnetic medium 140). The coil portion (231 in FIG. 1) of the voice coil motor is mounted at the opposite side of each arm in carriage 251. The voice coil motor has a permanent magnet 263 arranged at an opposite position across the coil 231.

Figure 3:
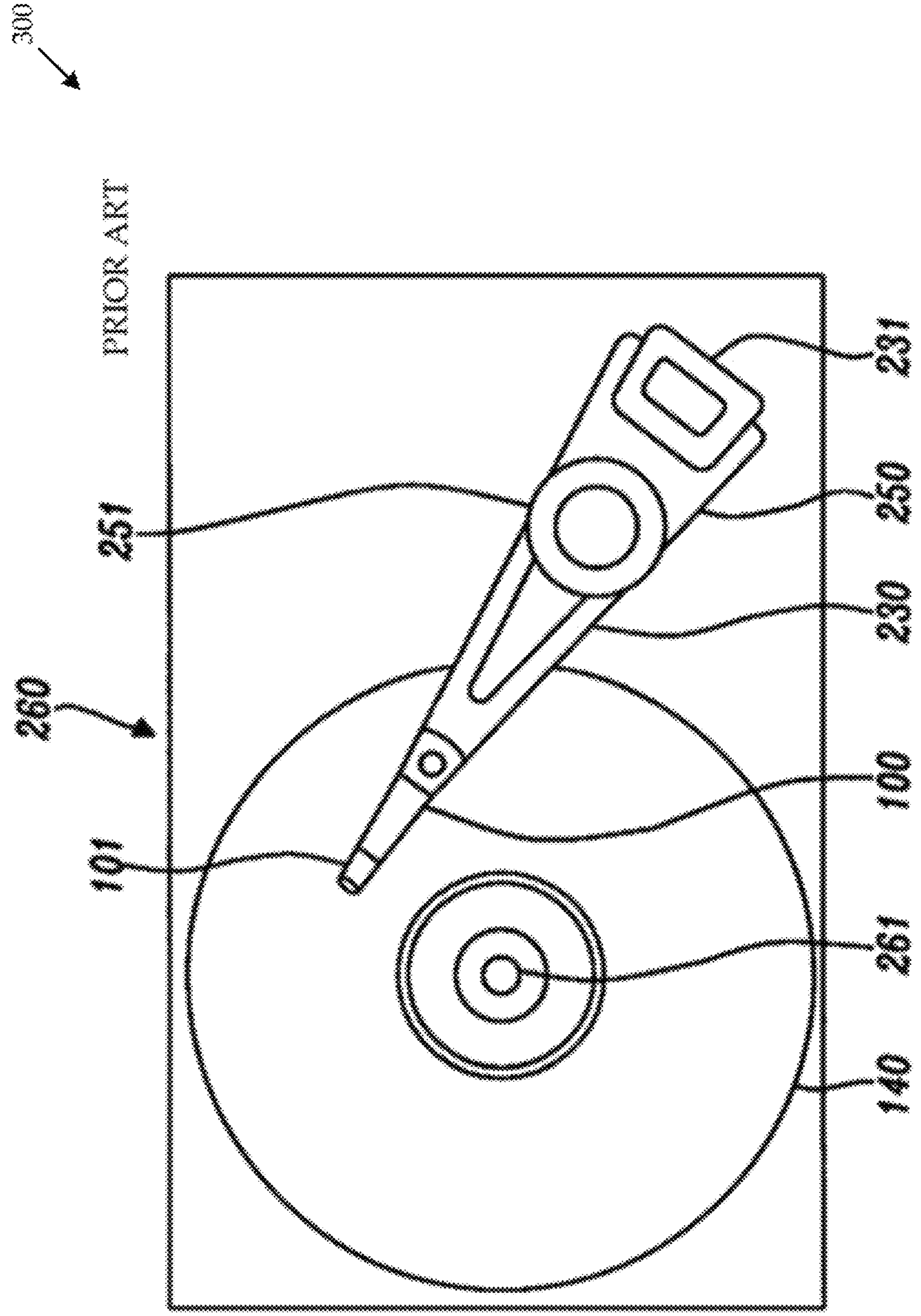
FIG. 3 is a plan view of a prior art magnetic recording apparatus, according to some embodiments.

With reference to FIG. 3, the head stack assembly 250 is incorporated in a magnetic recording apparatus 260. The magnetic recording apparatus has a plurality of magnetic media 140 mounted to spindle motor 261. For every magnetic recording medium, there are two magnetic recording heads arranged opposite one another across the magnetic recording medium. The head stack assembly and actuator except for the magnetic recording heads 101 correspond to a positioning device, and support the magnetic recording heads, and position the magnetic recording heads relative to the magnetic recording medium. The magnetic recording heads are moved in a cross-track of the magnetic recording medium by the actuator. The magnetic recording head records information into the magnetic recording media with a PMR writer element (not shown) and reproduces the information recorded in the magnetic recording media by a magneto-resistive (MR) sensor element (not shown).

In many products, the reader sensor can be made using a TMR sensor structure, which includes two ferromagnetic layers that are separated by a dielectric layer called a tunnel barrier. One of the ferromagnetic layers is referred to as a reference layer (RL) wherein the magnetization direction is fixed by exchange coupling with an adjacent antiferromagnetic (AFM) pinning layer. The second ferromagnetic layer is a free layer (FL) wherein the magnetization vector can rotate in response to external magnetic fields to be either parallel or anti-parallel to the magnetic moment in the RL depending on the magnetic field direction from the recording media. Digital data sequence made of "0" or "1" is translated into different magnetization directions on the recording media which is recorded by a write sensor in each recording head. As the FL rotates, the resistance measured by passing a current from the FL to the RL will change. The change in resistance is measured and used to decode the magnetization pattern from the recording media and reproduce the information that was recorded earlier.

Figure 4A:
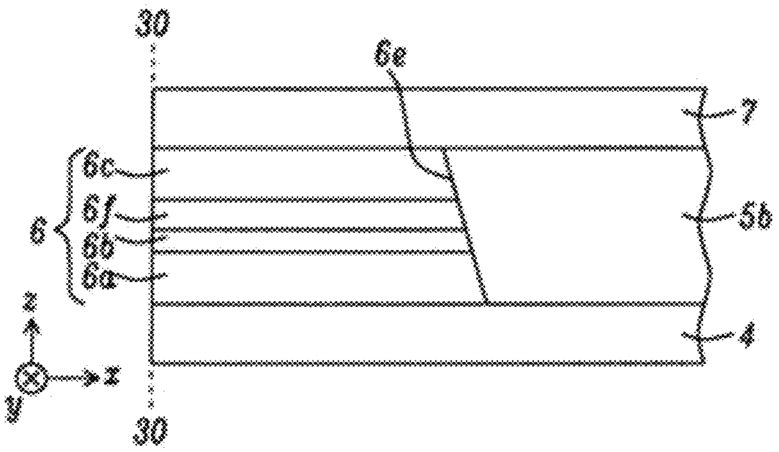
FIGS. 4A-4C illustrate example views of an example TMR reader, according to some embodiments.
Figure 4B:
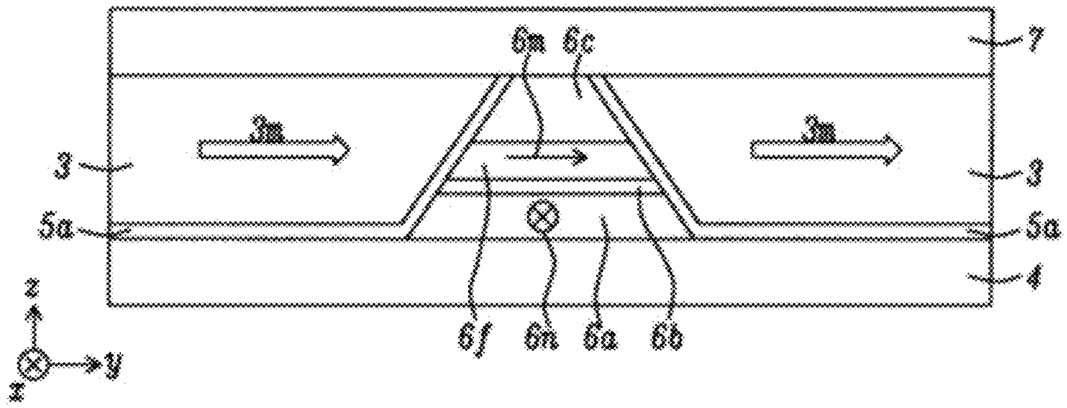
Figure 4C:
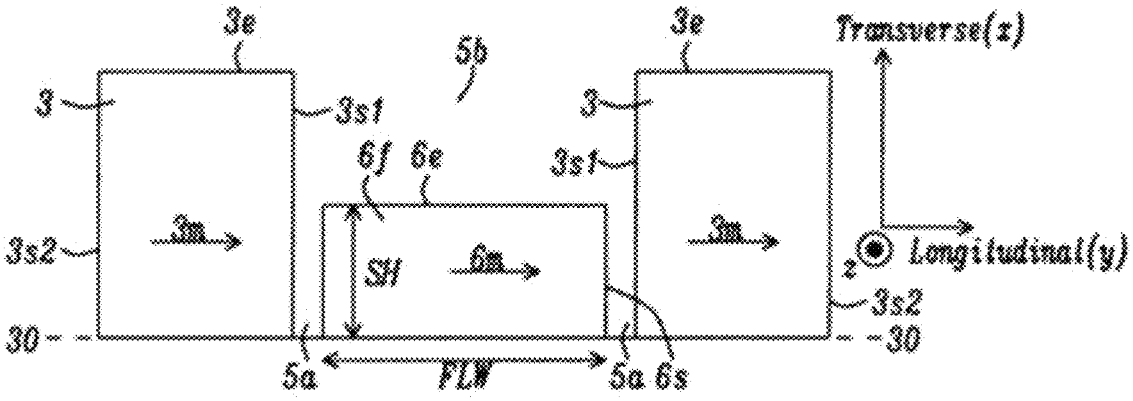

FIGS. 4A-4C illustrate example views of an example TMR reader. In FIG. 4A, one example of a TMR reader is shown having a sensor structure 6 formed between a lower shield 4 and an upper shield 7. The down-track cross-sectional view depicts a front side of the sensor structure at an ABS 30-30, and a backside **6*e* adjoining a dielectric (gap) layer 5*b*. In a so-called bottom spin valve configuration for the sensor structure, bottom portion 6*a* comprises a RL, and may also include one or multiple seed layers and an AFM layer on the seed layer (not shown). There is a tunnel barrier 6*b* between the RL and a FL 6*f*. Upper portion 6*c*** is a capping layer. In some designs, a part of the RL may be recessed from the ABS.

Referring to FIG. 4B, an ABS view of the TMR reader in FIG. 4A is illustrated and shows magnetization **3*m* in adjacent junction shields (JSs) 3 provide a longitudinal biasing effect to stabilize FL magnetization 6*m* in the absence of an external magnetic field. One or both of permanent magnetic material and soft magnetic material each having a magnetization aligned near the FL are generally used to bias the FL magnetization moment with respect to the RL so as to obtain a substantially orthogonal relative orientation between FL magnetization 6*m* and RL magnetization 6*n*** in a zero applied field environment.

FIG. 4C depicts a top-down view of the sensor structure in FIG. 4B where layers above the FL are removed. A JS 3 is formed adjacent to each side of FL **6*f* at the ABS 30-30. The longitudinal biasing scheme provides a JS magnetization 3*m* that is parallel to the ABS and to the FL magnetic moment 6*m* so that a single domain magnetization state in the FL can be stable against all reasonable perturbations when no external magnetic field is applied. An inner JS side 3*s*1 can be separated from the FL by a dielectric layer 5*a*. Each JS also has a front side at the ABS, a backside 3*e*, and an outer side 3*s*2** facing away from the FL. Note that the cross-track direction along the y-axis is known as the longitudinal direction, and a direction orthogonal to the ABS (along the x-axis) is referred to as the transverse direction.

Figure 5:
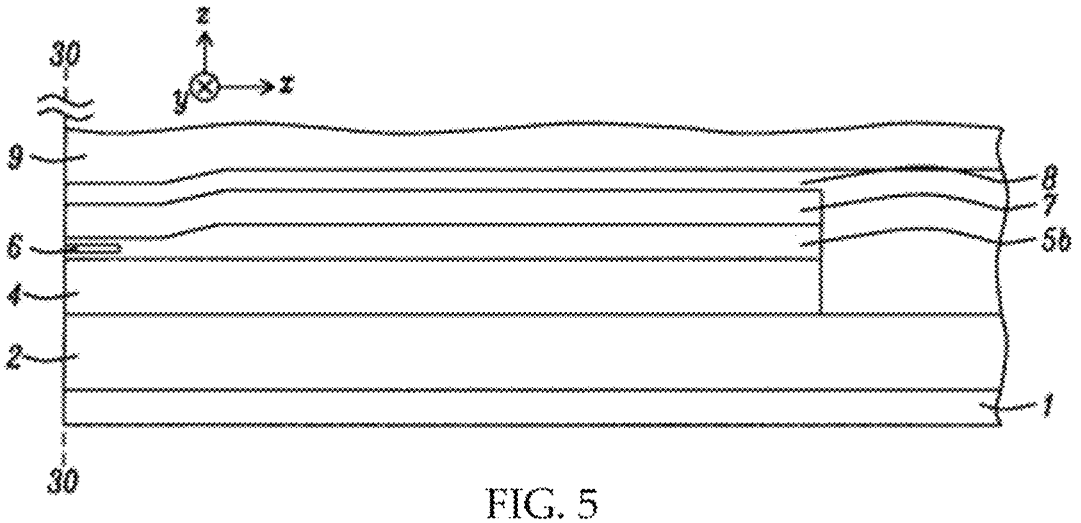
FIG. 5 is an example read head having a TMR sensor and JS structure, according to some embodiments.

FIG. 5 is an example read head having a TMR sensor and JS structure. Referring to FIG. 5, one embodiment of a read head having a TMR sensor and JS structure can be shown in a down-track cross-sectional view from a plane orthogonal to an air bearing surface (ABS) 30-30. It should be understood that the read head may be part of a combined read head-write head design wherein the write head portion (not shown) is formed on the read head. The read head is formed on a substrate 1 that may be comprised of AlTiC (alumina+TiC). Substrate 1 is typically part of a slider (not shown) formed in an array of sliders on a wafer. After the read head (or combined read head-write head) is fabricated, the wafer is sliced to form rows of sliders. Each row is typically lapped to afford an ABS before dicing to fabricate individual sliders that are used in a magnetic recording device.

The read head typically has a bottommost insulation layer 2 that is formed on substrate 1 and is made of a dielectric material such as alumina. A bottom shield 4 also referred to as the S1 shield is formed on insulation layer 2 and may be comprised of NiFe, CoFe, or CoFeNi. In some embodiments, the top shield is a so-called S2A shield. A magnetoresistive element also known as TMR sensor 6 is formed between the top and bottom shields and usually has a front side exposed at the ABS 30-30. There is a second insulation layer **5*b* between the bottom shield and a top shield 7**, and behind the TMR sensor. The read gap is defined as the distance between the top shield and bottom shield measured at the ABS.

Above the top shield 7, an insulation layer 8 and a shield (S2B) layer 9 are sequentially formed. Shield layers 7, 9 may be made of the same magnetic material or a different material as in the S1 shield 4, and insulation layer 8 may be the same dielectric material or a different material as in insulation layer 2. The present disclosure anticipates that various configurations of a write head may be employed with the read head structure disclosed herein.

Figure 6:
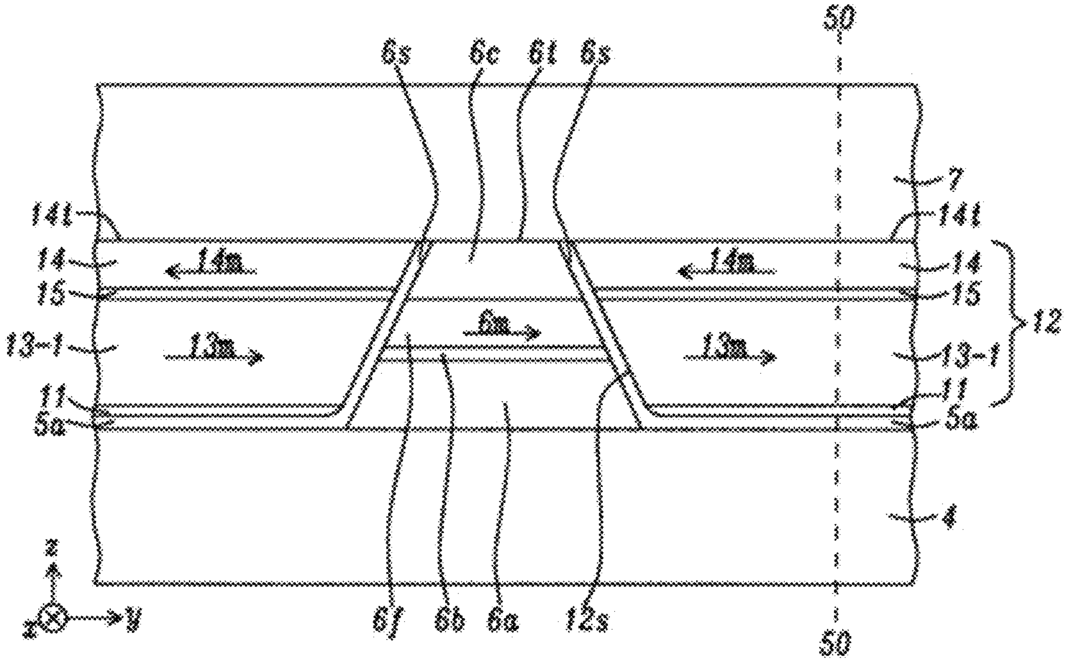
FIG. 6 is an example read head from an ABS view, according to some embodiments.

FIG. 6 is an example read head from an ABS view. Referring to FIG. 6, an enlarged section of the read head in FIG. 5 is depicted from an ABS perspective. The sensor structure 6 comprises a bottom portion **6*a*, tunnel barrier 6*b*, FL 6*f*, and a capping layer 6*c* that are sequentially formed on a top surface of bottom shield 4. Insulation layer 5*a* contacts sensor sidewalls 6*s*, and contacts the top surface of bottom shield 4 that is not covered by the sensor structure. An optional seed layer 11 is formed on a top portion of insulation layer 5*a* above bottom shield 4. The exemplary embodiment depicts a bottom spin valve configuration wherein layer 6*a*** comprises a RL that is formed below the tunnel barrier in the sensor structure.

In FIG. 6, a first embodiment of the JS structure 12 of the present disclosure is shown and comprises a lower JS layer 13-1, first AFC layer 15, and a second JS layer 14 sequentially formed on the optional seed layer 11 on each side of the sensor structure. The seed layer may be selected from NiCr, NiFeCr, NiFe, Cu, or Ni, or bilayer or multilayer stacks comprising Ta, Ru, and one or more of the aforementioned seed layer materials. Sidewall **12*s* of the JS structure adjoins insulation layer 5*a*. Each lower JS layer has magnetization 13*m* aligned parallel to FL magnetization 6*m* thereby providing the primary means of longitudinal biasing (stabilization) to FL 6*f* in the absence of an externally applied magnetic field. Each second JS layer has magnetization 14*m* aligned opposite to 13*m* as a result of AFC layer 15. AFC between layers 13-1, 14** has a net effect of stabilizing the JS. The junction shields prevent stray magnetic fields produced by a magnetic medium (not shown) from inadvertently switching the magnetization direction of the FL.

Although bottom portion **6*a* is depicted with a larger cross-track width than that of capping layer 6*c*, sidewalls 6*s* in other embodiments may be substantially vertical. Both shields 4 and 7 may be comprised of one or more of NiFe, CoFe, or CoFeNi, or other magnetic alloys thereof containing additional elements. JS layers 13-1, 14 are made of a soft magnetic material such as one or more of CoFe, NiFe, and CoFeNi, or other magnetic alloys thereof containing additional elements. In alternative embodiments, one or both JS layers are comprised of a hard magnetic material including one or more of CoPt, CoCrPt, FePt, and the like. AFC layer 15** is preferably Ru with an appropriate thickness.

Figure 7:
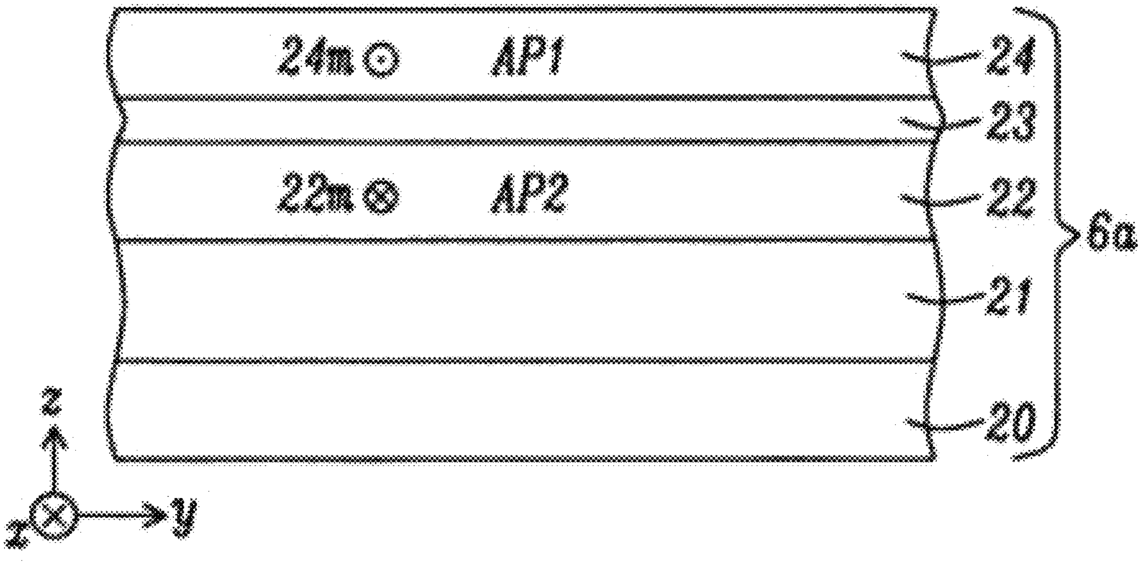
FIG. 7 is an example TMR sensor structure, according to some embodiments.

FIG. 7 is an example TMR sensor structure. According to one embodiment shown in FIG. 7, bottom portion **6*a* in the TMR sensor structure may comprise a bottommost seed layer 20, AFM layer 21, and a SyAP RL with an AP2/AFC layer/AP1 configuration. AP1 layer 24 contacts a bottom surface of tunnel barrier 6*b* and has a magnetization 24*m* out of the plane of the drawing. AP2 layer 22 is antiferromagnetically coupled to the AP1 layer 24 through AFC layer 23 and has magnetization 22*m* aligned anti-parallel to 24*m*. Furthermore, magnetization 22*m* is pinned in a fixed direction by AFM layer 21. Note that AP1 magnetization 24***m* is aligned orthogonal to FL magnetization 6*m* in the absence of an externally applied field (zero field environment). Each of the magnetic layers 6*f*, 22, 24 may be comprised of one or more of Co, Fe, and Ni, including alloys with B, Ta, Cr, or W. AFM layer 21 is generally comprised of PtMn, IrMn, or another suitable AFM material.

TMR sensors generally have a junction shield component with very low coercivity (Hc) to make the magnetization of the free layer be orthogonal to the magnetization of the reference layer. Example Hc values can be less than 10 Oersted (Oe), or even less than 5 Oe or 2 Oe. For instance, a permalloy Nickel-Iron (NiFe) material can be applied because of its extremely low Hc. As the dimensions of reader sensors decrease, a high moment free layer can be critical to maintain and increase performance. Additionally, a high moment junction shield can be important in TMR sensors. However, the magnetic moment of permalloy NiFe can be limited to 10 kilograms (kG). Tuning the alloy composition may not solve this issue. A rare earth doping to NiFe or cobalt-iron (CoFe) may maintain low Hc and boost the magnetic moment. On the other hand, the seed layer may also be a template to grow a soft magnetic alloy with a different crystalline.

In the present embodiments, an oxide seed layer can generally promote the magnetic moment of an Iron-Nickel-Rhenium (FeNiRe) junction shield film, and a magnesium oxide (MgO) seed layer can be a magnetic moment at the highest level (e.g., a magnetic moment up to around 15-16 kG) and provide a low Hc (e.g., an Hc down to about 2 Oe). Particularly, the present embodiments can provide a rare earth doped NiFe or CoFe for a junction shield application, such as a FeNiRe material for a junction shield application. Further, an oxide seed layer of a rare earth doped NiFe or CoFe can be used for junction shield application. In some instances, an oxide seed layer of FeNiRe film can be used for junction shield application. Additionally, a MgO seed layer of rare earth doped NiFe or CoFe or a MgO/FeNiRe layer can be used for a junction shield application.

In the present embodiments, an oxide seed layer can generally promote magnetic moment, and MgO seed layer can boost the magnetic moment at the highest level (e.g., boost around 20%) and reveal a low Hc.

Figure 8:
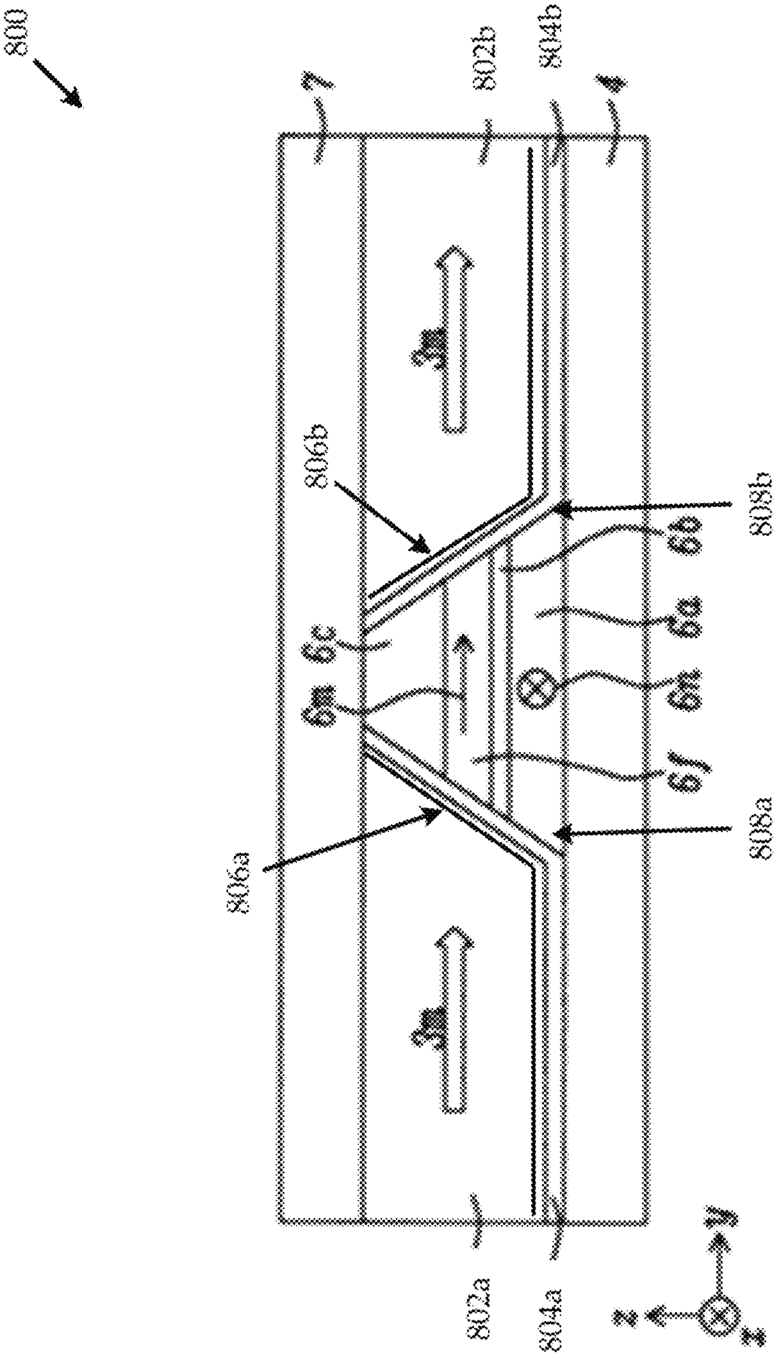
FIG. 8 illustrates a first example TMR sensor structure, according to some embodiments.

FIG. 8 illustrates a first example TMR sensor structure 800. As shown in FIG. 8, the structure can include JS components disposed on either side of a sensor structure (e.g., 6*a*-*n*).

Each JS component can include a JS layer 802*a*, 802*b* and an insulation layer 804*a*, 804*b* adjacent to a sidewall 808*a*, 808*b* of the sensor structure.

The JS layers can include a FeNiRe alloy doped with Rhenium (Re) or a NiFe material. The Insulation layer can include an oxide such as MgO or a multi-layer oxide structure comprising a first MgO layer, another oxide, and a second MgO layer. In some instances, an Iron-Nickel-Rhenium (NiFeRe) film 806*a*, 806*b* can be disposed adjacent to the insulation layer 804*a*, 804*b*.

Figure 9:
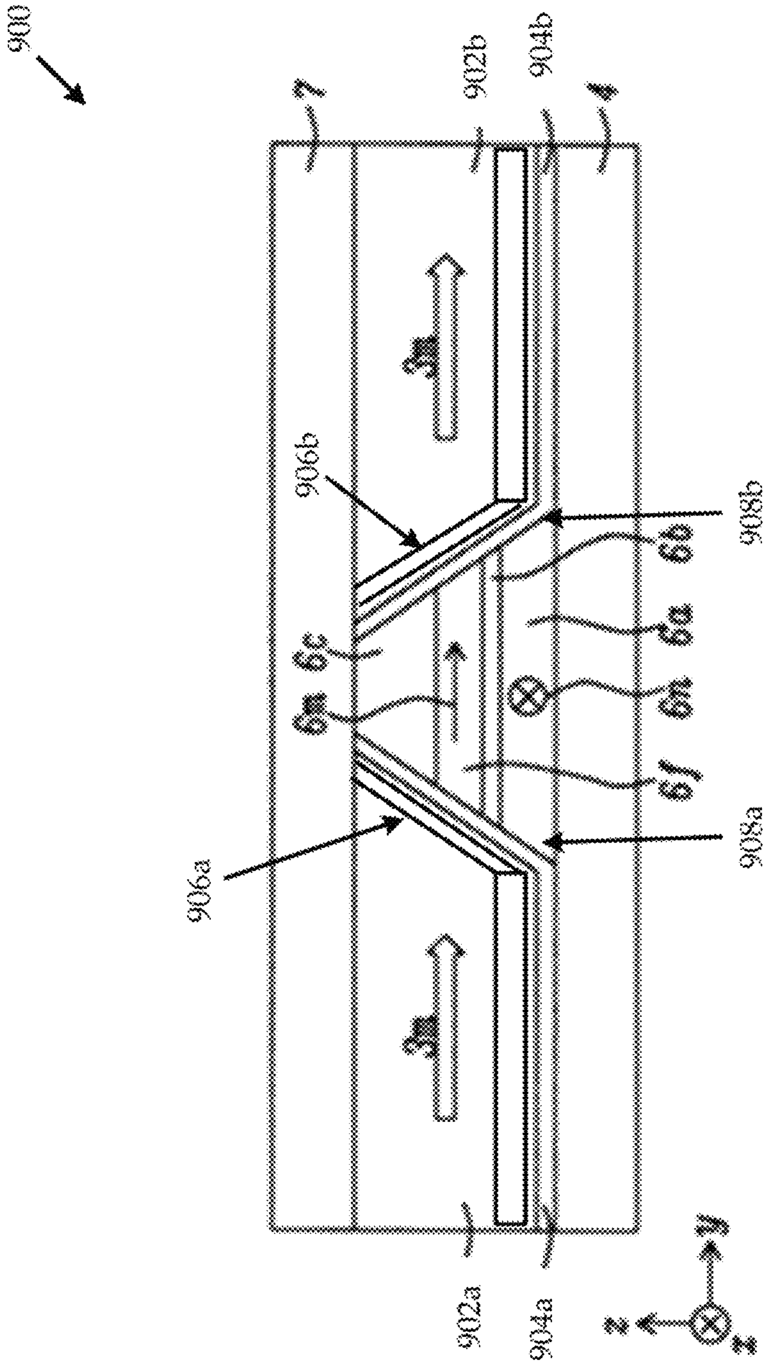
FIG. 9 illustrates a second example TMR sensor structure, according to some embodiments.

FIG. 9 illustrates a second example TMR sensor structure 900. As shown in FIG. 9, the TMR sensor structure 900 can include a JS layer 902*a*, 902*b*, insulation layers 904*a*, 904*b*, and a seed layer 906*a*, 906*b* disposed between the JS layer 902*a*, 902*b* and the insulation layer 904*a*, 904*b*. The insulation layers can contact a sidewall of the sensor structure (e.g., 908*a*, 908*b*) and contacts a top surface of a bottom shield (e.g., 4) that is not covered by the sensor structure.

Figure 10:
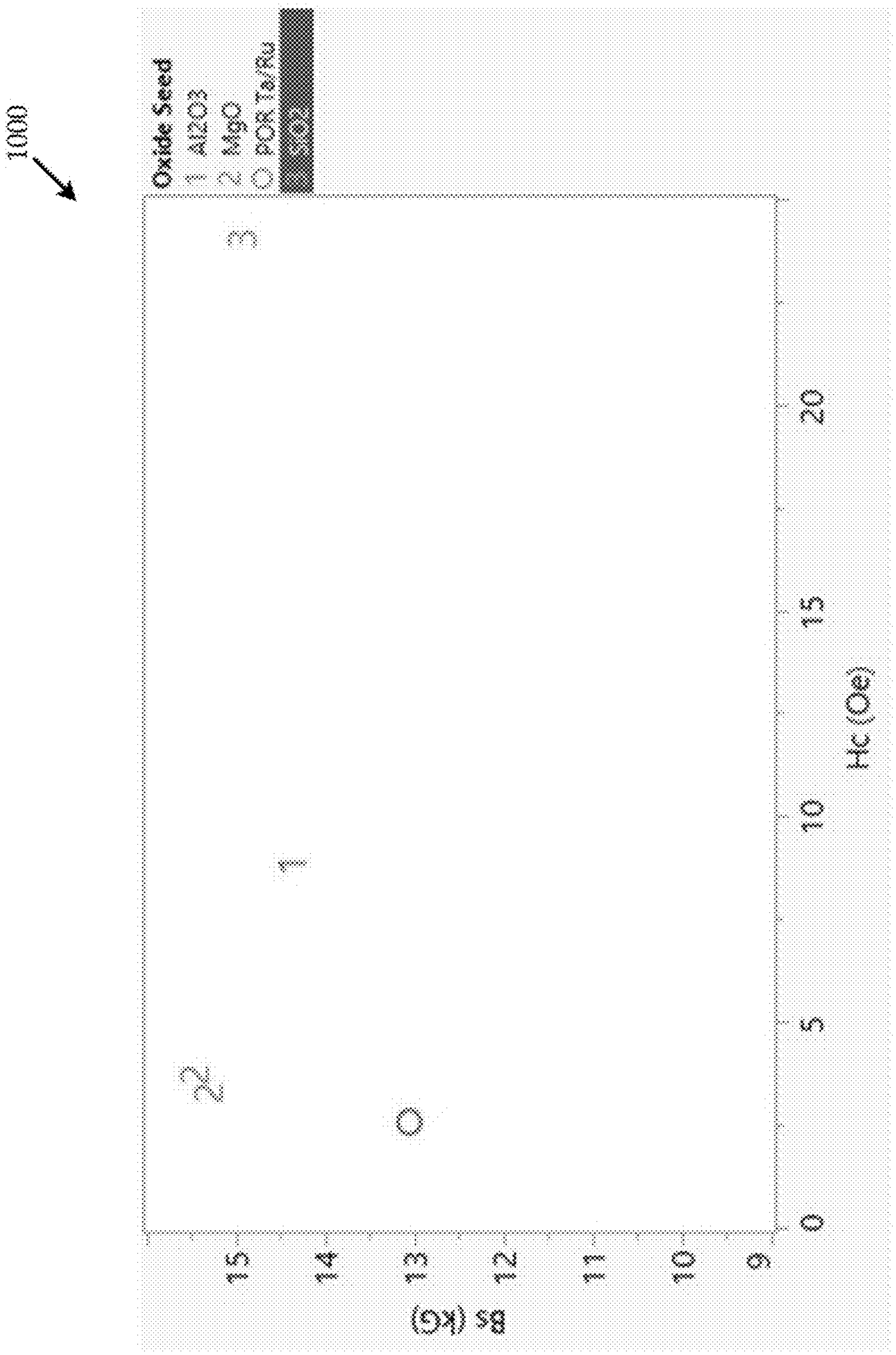
FIG. 10 is a graphical representation of the moment and Hc of FeNiRe film on MgO, SiO2 and Al2O3 seed layers compared with the POR Ta/Ru seed layer, according to some embodiments.

FIG. 10 is a graphical representation 1000 of the moment and Hc of FeNiRe film on MgO, SiO2 and Al2O3 seed layers compared with the POR Ta/Ru seed layer. The MgO seed layer can be a unique material to meet both requirements of the high moment and low Hc.

Figure 11:
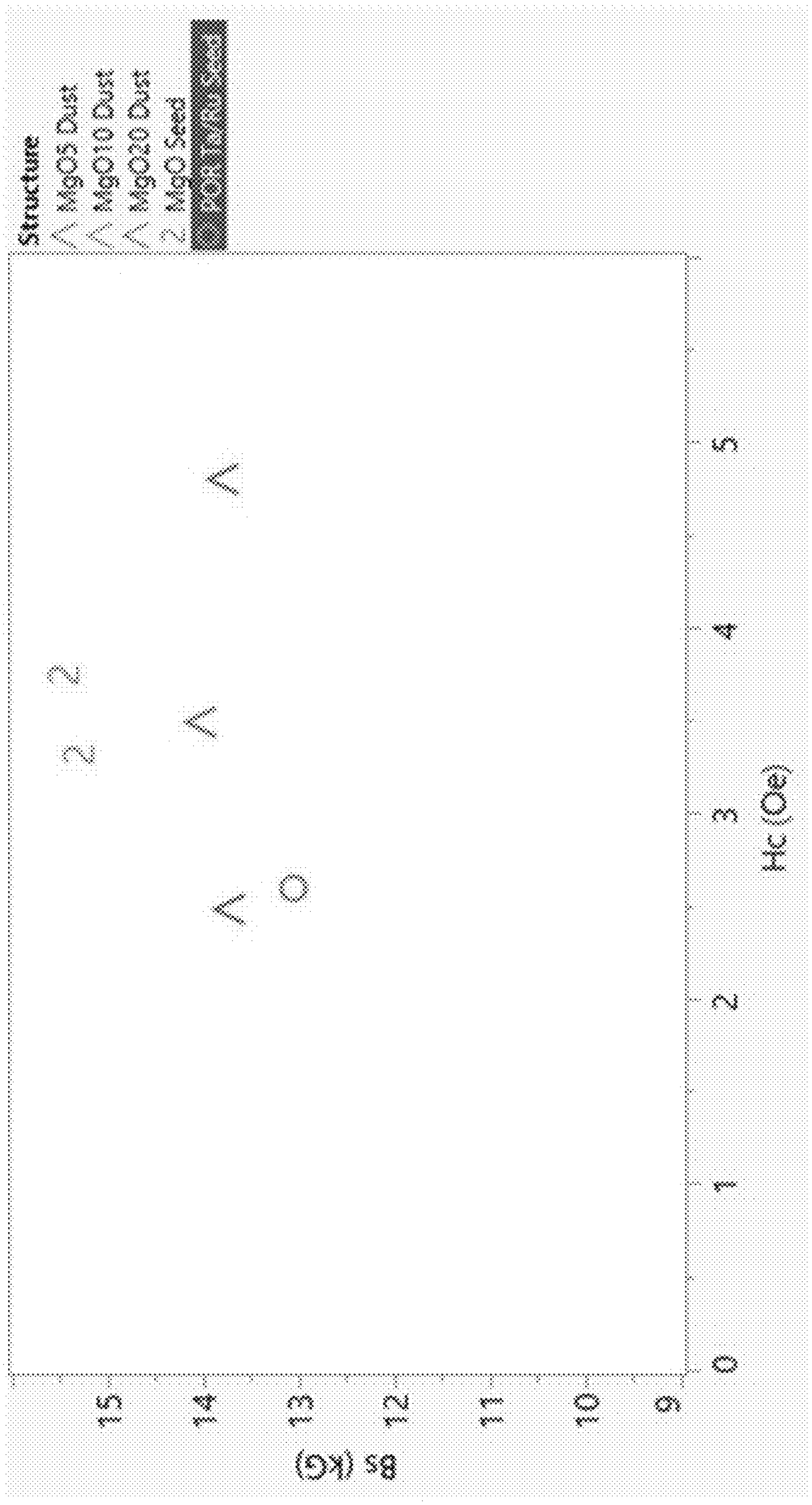
FIG. 11 is a graphical representation of the moment and Hc of the dusting stack with POR Ta/Ru seed layer and MgO seed layer, according to some embodiments.

Compared with POR Ta/Ru seed layer, MgO seed layer may have issues to post process, such as element diffusion downgrading encapsulation reliability, corrosion, mechanical stress, and etching rate, for example. Further, oxide dusting (insertion) layer with a stack of MgO/Ta/Ru/MgO/FeNiRe can be examined. FIG. 11 is a graphical representation 1100 of the moment and Hc of the dusting stack with POR Ta/Ru seed layer and MgO seed layer. The MgO dusting layer can consistently promote magnetic moment and can indicate that the concept of the MgO seed layer is correct. However, the MgO dusting may not fully recover the magnetic moment, which can indicate that MgO dusting may not be a direct solution for both high moment and low Hc.

Figure 12:
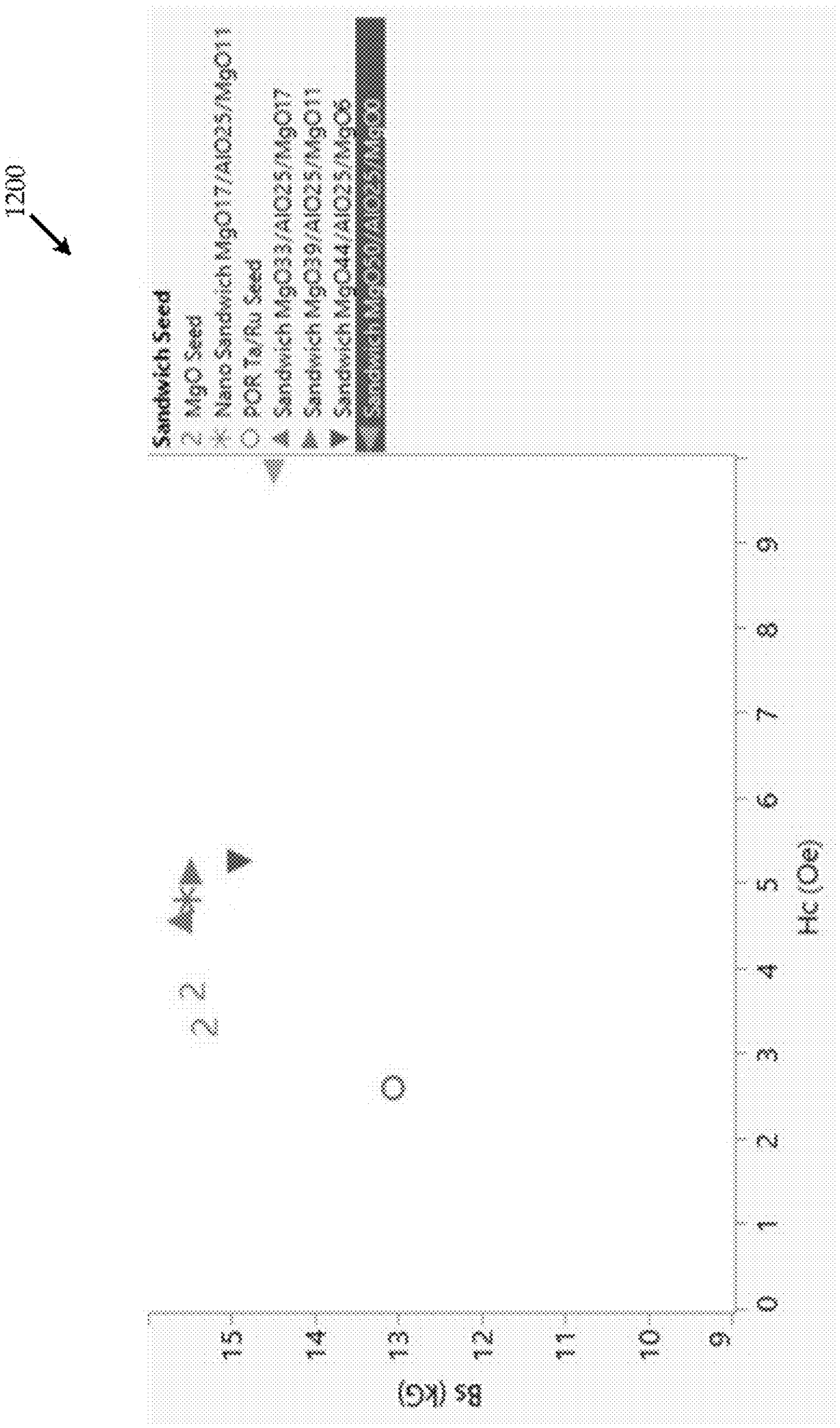
FIG. 12 is a graphical representation of the moment and Hc of FeNiRe thin film with MgO/Al2O3/MgO sandwich seed layer with POR Ta/Ru seed layer and MgO seed layer, according to some embodiments.

Another option is to insert another oxide layer into MgO to relieve the post process concerns to the mechanical stress, corrosion, etching rate and element diffusion. A MgO/Al2O3/MgO sandwich seed layer can be tested. FIG. 12 is a graphical representation 1200 of the moment and Hc of FeNiRe thin film with MgO/Al2O3/MgO sandwich seed layer with POR Ta/Ru seed layer and MgO seed layer. The MgO/Al2O3/MgO sandwich seed layer can maintain the highest magnetic moment and low Hc. Here, the Al2O3 can be buried in MgO at the different depth and it may not be sensitive once MgO reaches a critical thickness at around 10 Angstrom. The thinner bottom MgO can include about 20 Angstrom MgO to maintain the high moment and low Hc.

Figure 13:
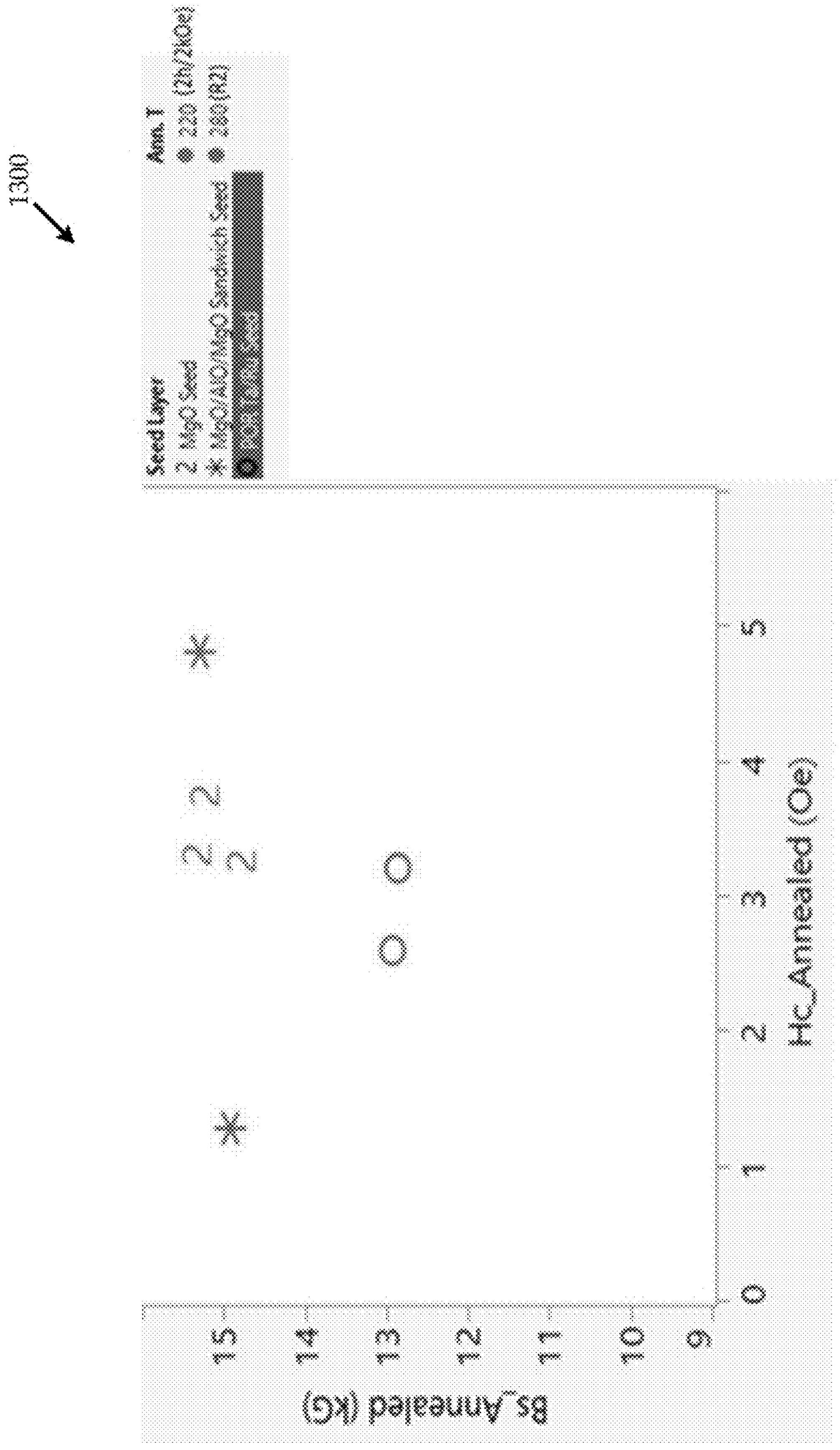
FIG. 13 is a graphical illustration that compares performance annealed at 220° C. and 280° C., according to some embodiments.

ABS and Hc after high temperature anneal are important for 2DMR application. FIG. 13 is a graphical illustration 1300 that compares performance annealed at 220° C. and 280° C.

There is no obvious change after 280° C. anneal. These results confirms that MgO/Al2O3/MgO sandwich seed layer maintains the highest magnetic moment and low Hc for both 1DMR and 2DMR applications.

In a first example embodiment, a tunneling magnetoresistive (TMR) sensor is described. The sensor can include a sensor structure. The sensor can also include a first junction shield (JS) layer disposed adjacent to the sensor structure, wherein the JS layer comprises a Nickel-Iron (NiFe) alloy doped with a rare earth material. The sensor can also include a first insulation layer disposed between the JS layer and the sensor structure at a first side of the sensor structure, the first insulation layer comprising an oxide material.

In some instances, the rare earth material comprises Rhenium (Re).

In some instances, the first JS layer is configured to maintain a low Hc and boost the magnetic moment of the TMR sensor.

In some instances, the sensor can include a seed layer disposed between the first JS layer and the first insulation layer.

In some instances, the first insulation layer comprises Magnesium Oxide (MgO).

In some instances, the first insulation layer comprises a first MgO layer, a second MgO layer, and an Aluminum Oxide (Al2O3) layer disposed between the first MgO layer and the second MgO layer.

In some instances, the sensor can include an Iron-Nickel-Rhenium (NiFeRe) film disposed adjacent to the first insulation layer.

In some instances, the first insulation layer contacts a sidewall of the sensor structure and contacts a top surface of a bottom shield that is not covered by the sensor structure.

In some instances, a second JS layer is disposed at a second side of the sensor structure opposite of the first side, and wherein a second insulation layer is disposed between the second JS layer and the sensor structure at the second side of the sensor structure.

In another example embodiment, a junction shield (JS) structure is provided. The JS structure can include a first junction shield (JS) layer, wherein the JS layer comprises a Nickel-Iron (NiFe) material. The JS structure can also include a first insulation layer comprising an oxide material. The JS structure can also include a seed layer disposed between the first JS layer and the first insulation layer.

In some instances, the JS layer comprises Nickel-Iron (NiFe) doped with a rare earth material.

In some instances, the rare earth material comprises Rhenium (Re).

In some instances, the first insulation layer comprises Magnesium Oxide (MgO).

In some instances, the first insulation layer comprises a first MgO layer, a second MgO layer, and an Aluminum Oxide (Al2O3) layer disposed between the first MgO layer and the second MgO layer.

In some instances, the JS layer comprises an Iron-Nickel-Rhenium (NiFeRe) film disposed adjacent to the first insulation layer.

In some instances, the first insulation layer contacts a sidewall of a sensor structure and contacts a top surface of a bottom shield of a tunneling magneto-resistive (TMR) sensor that is not covered by the sensor structure.

In some instances, the first JS layer is disposed at a first side of the sensor structure and a second JS layer is disposed at a second side of the sensor structure opposite of the first side, and wherein a second insulation layer is disposed between the second JS layer and the sensor structure at the second side of the sensor structure.

In another example embodiment, a method of manufacturing a junction shield (JS) component that is part of a tunneling magneto-resistive (TMR) sensor is provided. The method can include disposing a first junction shield (JS) layer adjacent to the sensor structure, wherein the first JS layer comprises a Nickel-Iron (NiFe) alloy. The method can also include doping the first JS layer with Rhenium (Re) to form a NiFeRe. The method can also include disposing a first insulation layer between the JS layer and the sensor structure at a first side of the sensor structure, the first insulation layer comprising an oxide material.

In some instances, the method can include disposing a seed layer disposed between the first JS layer and the first insulation layer.

In some instances, the method can include disposing a second JS layer at a second side of the sensor structure opposite of the first side and disposing a second insulation layer between the second JS layer and the sensor structure at the second side of the sensor structure.

It will be understood that terms such as "top," "bottom," "above," "below," and x-direction, y-direction, and z-direction as used herein as terms of convenience that denote the spatial relationships of parts relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

It will be appreciated that the term "present invention" as used herein should not be construed to mean that only a single invention having a single essential element or group of elements is presented. Similarly, it will also be appreciated that the term "present invention" encompasses a number of separate innovations, which can each be considered separate inventions. Although the present invention has been described in detail with regards to the preferred embodiments and drawings thereof, it should be apparent to those skilled in the art that various adaptations and modifications of embodiments of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A tunneling magneto-resistive (TMR) sensor, comprising:

a sensor structure;

a first junction shield (JS) layer disposed adjacent to the sensor structure, wherein the JS layer comprises a Nickel-Iron (NiFe) alloy doped with Rhenium (Re) to form a NiFeRe JS layer; and a first insulation layer disposed between the JS layer and the sensor structure at a first side of the sensor structure, the first insulation layer comprising an oxide material, the first insulation layer comprises a first MgO layer, a second MgO layer, and an Aluminum Oxide (Al2O3) layer disposed between the first MgO layer and the second MgO layer.

2. The TMR sensor of claim 1, wherein the first JS layer is configured to maintain a low Hc and boost the magnetic moment of the TMR sensor.

3. The TMR sensor of claim 1, further comprising:

a seed layer disposed between the first JS layer and the first insulation layer.

4. The TMR sensor of claim 1, further comprising an Iron-Nickel-Rhenium (NiFeRe) film disposed adjacent to the first insulation layer.

5. The TMR sensor of claim 1, wherein the first insulation layer contacts a sidewall of the sensor structure and contacts a top surface of a bottom shield that is not covered by the sensor structure.

6. The TMR sensor of claim 1, wherein a second JS layer is disposed at a second side of the sensor structure opposite of the first side, and wherein a second insulation layer is disposed between the second JS layer and the sensor structure at the second side of the sensor structure.

* * * * *